(12) United States Patent
Ohama et al.

(10) Patent No.: US 7,693,246 B2
(45) Date of Patent: Apr. 6, 2010

(54) FREQUENCY CONTROL DEVICE AND INFORMATION REPRODUCTION APPARATUS

(75) Inventors: Tomohiro Ohama, Kanagawa (JP); Junkichi Sugita, Kanagawa (JP); Nobuyuki Asai, Kanagawa (JP)

(73) Assignee: Sony Corporation, Tokyo (JP)

( * ) Notice: Subject to any disclaimer, the term of this patent is extended or adjusted under 35 U.S.C. 154(b) by 987 days.

(21) Appl. No.: 11/439,123

(22) Filed: May 24, 2006

(65) Prior Publication Data

US 2006/0274864 A1 Dec. 7, 2006

(30) Foreign Application Priority Data

May 26, 2005 (JP) ............................ P2005-154296

(51) Int. Cl.
H04L 7/00 (2006.01)
H03D 3/24 (2006.01)
G11B 15/00 (2006.01)

(52) U.S. Cl. ...................... 375/368; 375/355; 369/47.48

(58) Field of Classification Search ................ 375/354, 375/362–366, 368, 355, 371–373, 376; 370/503, 370/509–514
See application file for complete search history.

(56) References Cited

U.S. PATENT DOCUMENTS

| 5,541,960 A | * | 7/1996 | Satomura et al. | ............ 375/368 |
| 2002/0048327 A1 | * | 4/2002 | Watanabe et al. | ............ 375/340 |
| 2003/0137765 A1 | * | 7/2003 | Yamazaki et al. | ............. 360/39 |

FOREIGN PATENT DOCUMENTS

JP 11-149704 6/1999

* cited by examiner

*Primary Examiner*—Tesfaldet Bocure
(74) *Attorney, Agent, or Firm*—Rader, Fishman & Grauer PLLC

(57) ABSTRACT

A frequency control device capable of detecting a frame sync pattern and generating a frequency information accurately even if a reproduction signal is not zero-crossed, and an information reproduction apparatus having the same, which includes an oscillation circuit outputting a clock having a frequency corresponding to a control signal; a converter sampling an input analog signal having a predetermined pattern based on the clock and converting the same to a digital signal; and a frequency detection device detecting an object to be a sync pattern from a changing trend of the digital signal, generating a frequency information for controlling a reproduction clock based on the detected object to be the sync pattern, and outputting the same as the control signal to the oscillation circuit.

9 Claims, 7 Drawing Sheets

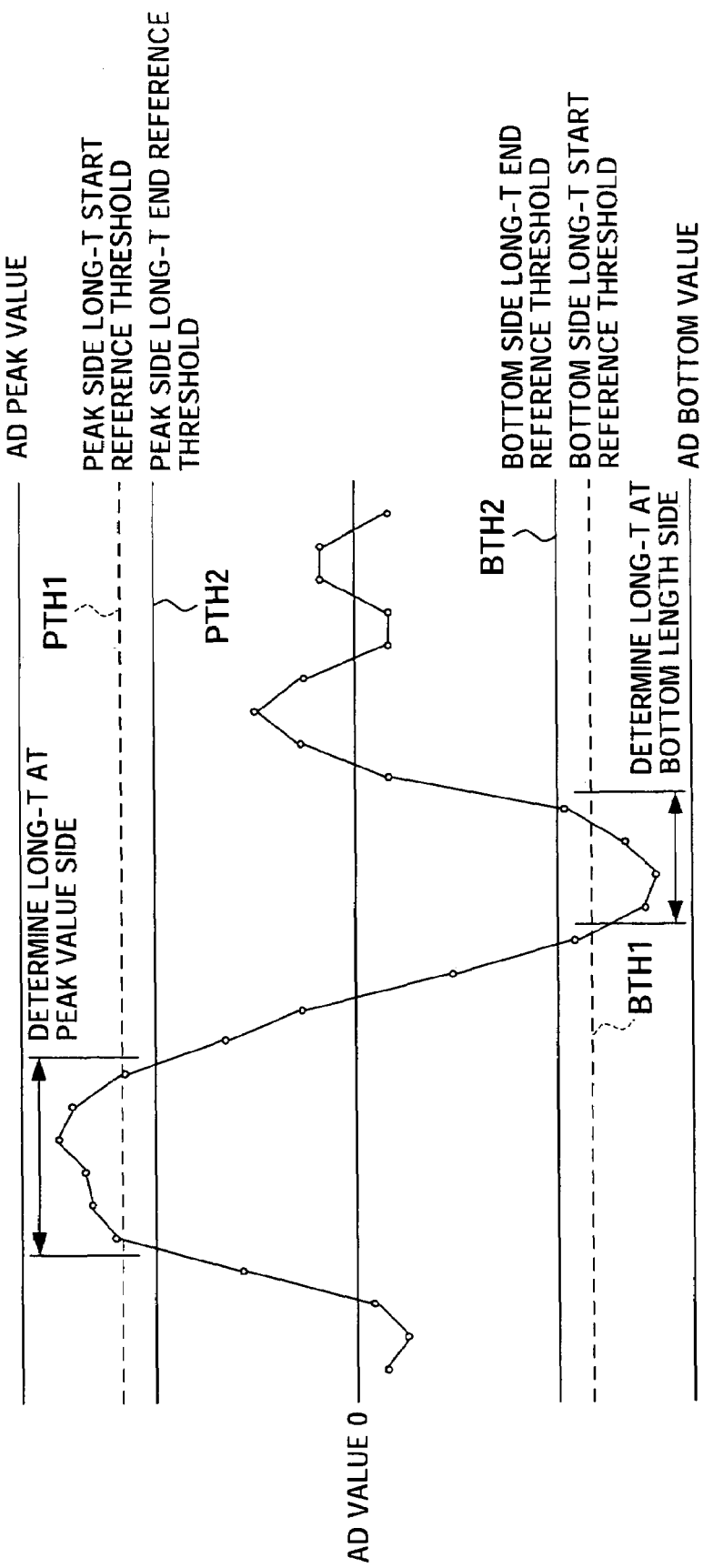

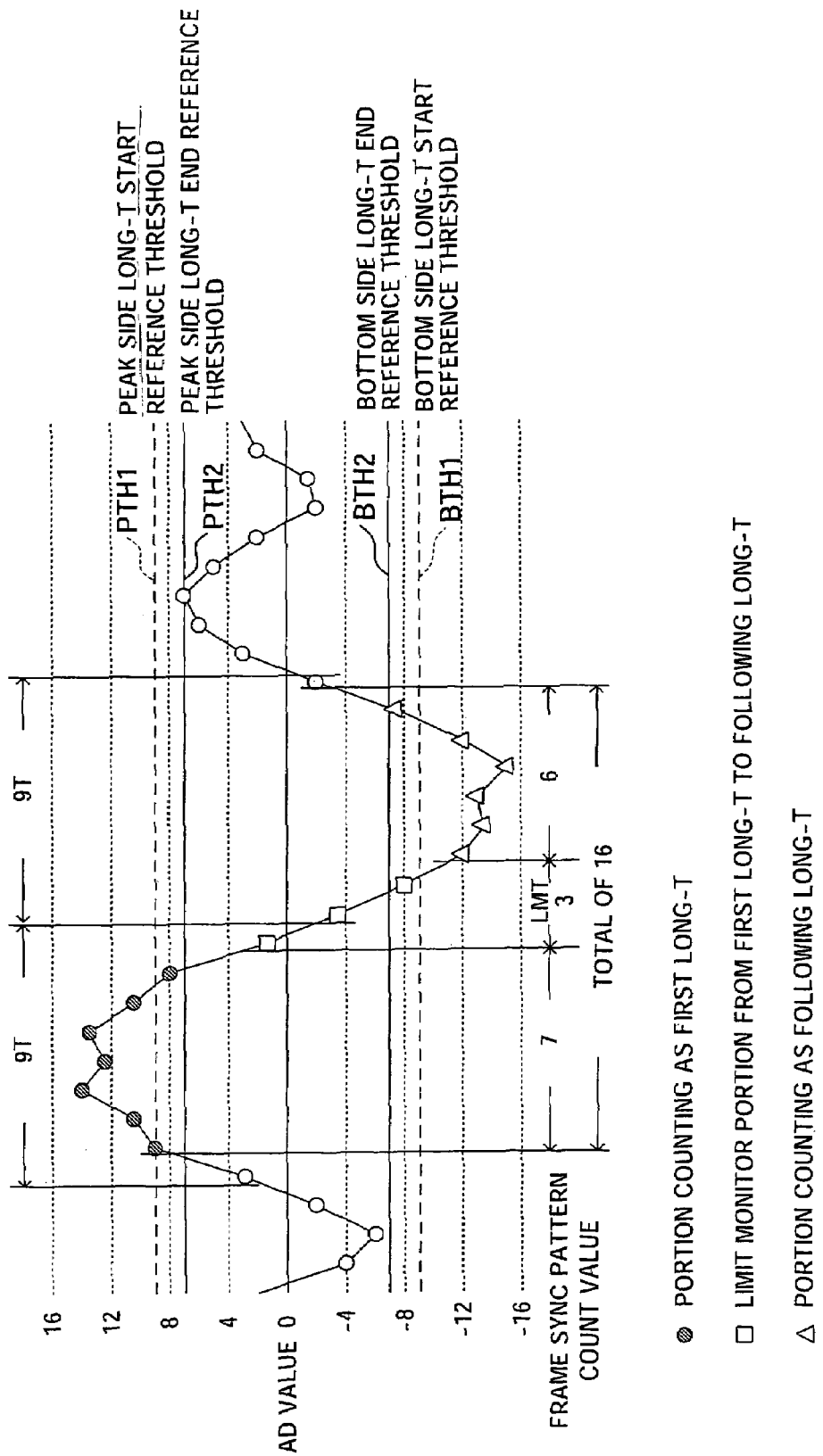

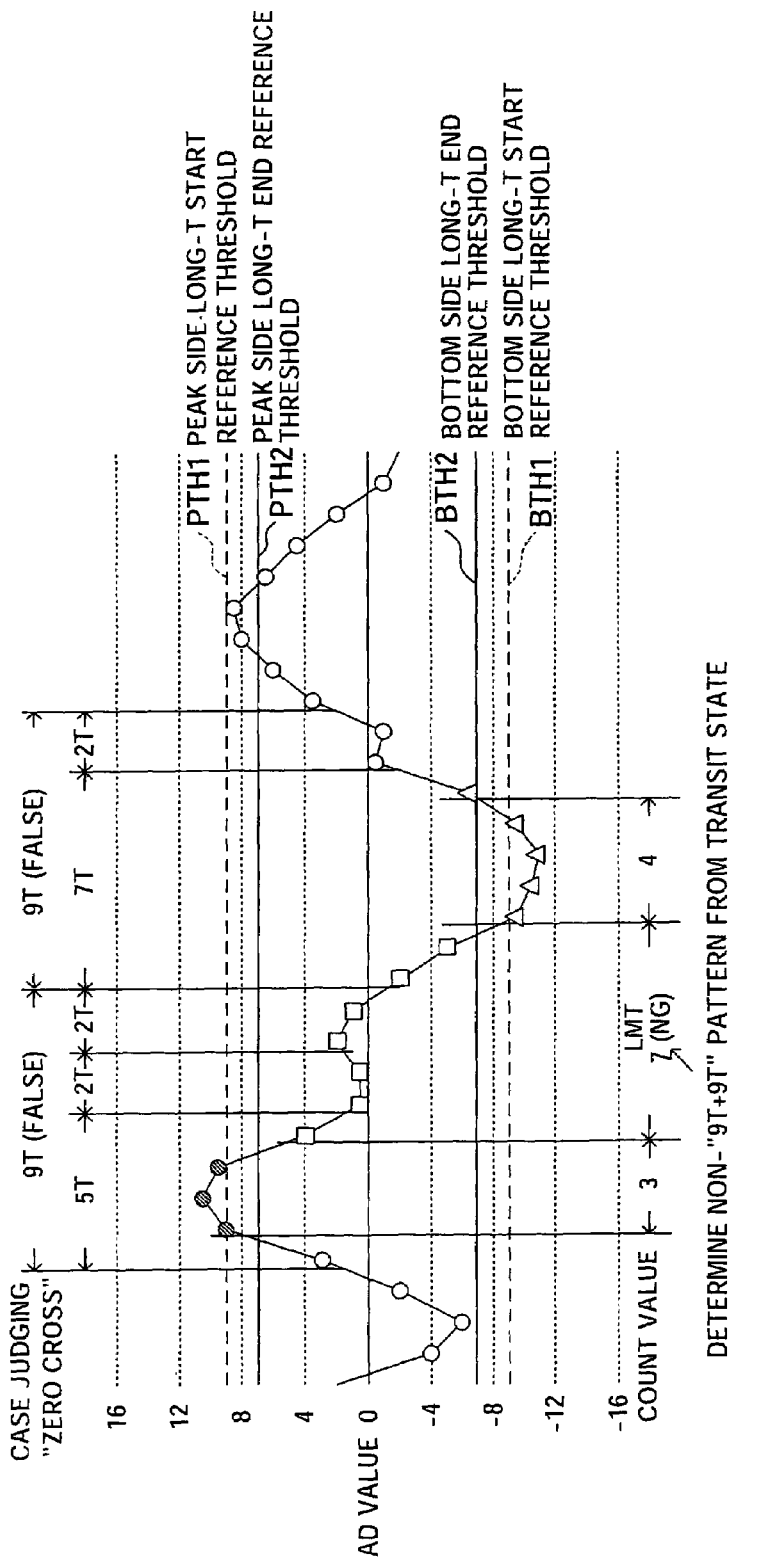

FREQUENCY CONTROL DEVICE AND INFORMATION REPRODUCTION APPARATUS

CROSS REFERENCES TO RELATED APPLICATIONS

The present invention contains subject matter related to Japanese Patent Application JP 2005-154296 filed in the Japanese Patent Office on May 26, 2005, the entire contents of which are incorporated herein by reference.

BACKGROUND OF THE INVENTION

1. Field of the Invention

The present invention relates to a frequency control device applied to an RF signal processing system, such as an optical disk, and an information reproduction apparatus having the same.

2. Description of the Related Art

There is known a frequency detection device used as a clock oscillation frequency control for a phase locked loop (PLL) circuit and a rotation control for a spindle in an optical disk or a hard disk drive (HDD).

As the control for a clock oscillation frequency by the PLL, there is known the following two methods, for example.

A first method is that a frequency detection device, in which a reproduction signal is sampled with a reproduction clock generated by the PLL and a difference of a maximum length pattern of a sampled mark length/space length (hereinafter, referred to a T-length) with respect to a maximum T-length defined by a format is calculated to determine a frequency drift of a PLL clock, is used and a frequency control amount is fed back to the PLL.

A second method is that a frequency detection device, in which a frame sync pattern is detected and a difference of an interval between detected frame sync patterns with respect to an interval between frame sync patterns defined by a format is calculated to determine the frequency drift of a PLL clock, is used and a frequency control amount is fed back to the PLL (for example, referred to Japanese Unexamined Patent Application (Kokai) No. 11-149704).

SUMMARY OF THE INVENTION

It is demanded that both the above methods determine the T-length. A method for judging the T-length is generally to determine the zero cross of a reproduction signal as a segment of the T-length.

However, when a recording density rises, the reproduction signal sometimes is not zero-crossed in a changing point of "T" due to an intersymbol interference. In this case, the segment of the T-length is not able to be determined, so the above frequency detection device is not able to be used.

The present invention is to provide a frequency control device capable of detecting a frame sync pattern and generating a frequency information accurately even if the reproduction signal is not zero-crossed and an information reproduction apparatus having the same.

According to a first aspect of an embodiment of the present invention, there is provided a frequency control device having: an oscillation circuit outputting a clock having a frequency corresponding to a control signal; a converter sampling an analog input signal having a predetermined pattern based on the clock and converting the same to a digital signal; and a frequency detection device detecting an object to be a sync pattern from a changing trend of the digital signal, generating a frequency information for controlling a reproduction clock based on the detected object to be the sync pattern, and outputting the frequency information as the control signal to the oscillation circuit.

According to a second aspect of an embodiment of the present invention, there is provided an information reproduction apparatus having: a recording medium, a converter sampling a sine-curved signal reproduced from the recording medium based on a clock and converting the signal to a digital signal, an oscillation circuit outputting the clock having a frequency corresponding to a control signal, and a frequency detection device detecting an object to be a sync pattern from a changing trend of the digital signal, generating a frequency information for controlling a reproduction clock based on the detected object to be the sync pattern, and outputting the frequency information as the control signal to the oscillation circuit.

Preferably, the frequency detection device has a peak bottom value detection unit detecting a peak value and a bottom value from an input digital signal, a setting unit setting a predetermined hysteresis with respect to the detected peak value and the bottom value, a comparison judgment unit comparing the hysteresis values of the peak value and the bottom value with the input digital signal, detecting a pattern having a long inversion interval, judging whether or not a pattern having a long inversion interval at an opposite side to the peak or the bottom is continued, and determining a case where the pattern having the long inversion interval is continued as an object to be a frame sync pattern and a measurement unit counting a number of judging clocks of the object to be the frame sync pattern during determining the object to be the frame sync pattern, and measuring the number of clocks as a length of the object to be the frame sync pattern.

Preferably, the comparison judgment unit has a judgment unit comparing the hysteresis values of the peak value and the bottom value with the input digital signal, and judging whether or not the input digital signal exceeds the hysteresis value of the peak value and falls below the hysteresis value of the bottom value, a determination unit judging whether or not the input digital signal exceeding the hysteresis value of the peak value and falling below the hysteresis value of the bottom value is continued from the judged result of the judgment unit, and determining that the pattern having the long inversion interval is continued, and a pattern determination unit judging whether or not the pattern having the long inversion interval at the opposite side to the peak or the bottom is continued after detecting the pattern having the long inversion interval, and determining a case where the pattern having the long inversion interval is continued successively twice as the object to be the frame sync pattern.

Preferably, the comparison judgment unit sets a limit monitor portion in a period from the detection of a first pattern having the long inversion interval to the detection of the following pattern having the long inversion interval at the opposite side and determines that the object to be the frame sync pattern is detected when a detection of the long pattern at the opposite side starts from the finish of the detection of the first long pattern within the limit monitor portion, while it determines that the object to be the frame sync pattern is not detected when the detection of the long pattern at the opposite side does not start within the limit monitor portion.

Preferably, the peak bottom detection unit has a peak bottom value detection unit detecting the peak value and the bottom value from the input digital signal, a holding unit holding the detected peak value and bottom value during a predetermined time, and an update unit detecting the peak value and the bottom value from the detected input digital signal during holding the peak value and the bottom value in the holding unit.

BRIEF DESCRIPTION OF THE DRAWINGS

The above and other features of embodiments of the present invention will be apparent in more detail with reference to the accompanying drawings, in which:

FIG. 5 is a view illustrating a relationship of a threshold value generated by a threshold value generation unit according to the present embodiment;

FIG. 6 is a view illustrating an example detecting an object to be a frame sync pattern in an AD value comparison judgment unit according to the present embodiment; and FIG. 7 is a view illustrating an example interpreting a detection because of judging the object not to be the frame sync pattern in the AD value comparison judgment unit according to the present embodiment.

DESCRIPTION OF THE PREFERRED EMBODIMENTS

Preferred embodiments according to the present invention will be described in more detail with reference to the accompanying drawings.

Figure 1:
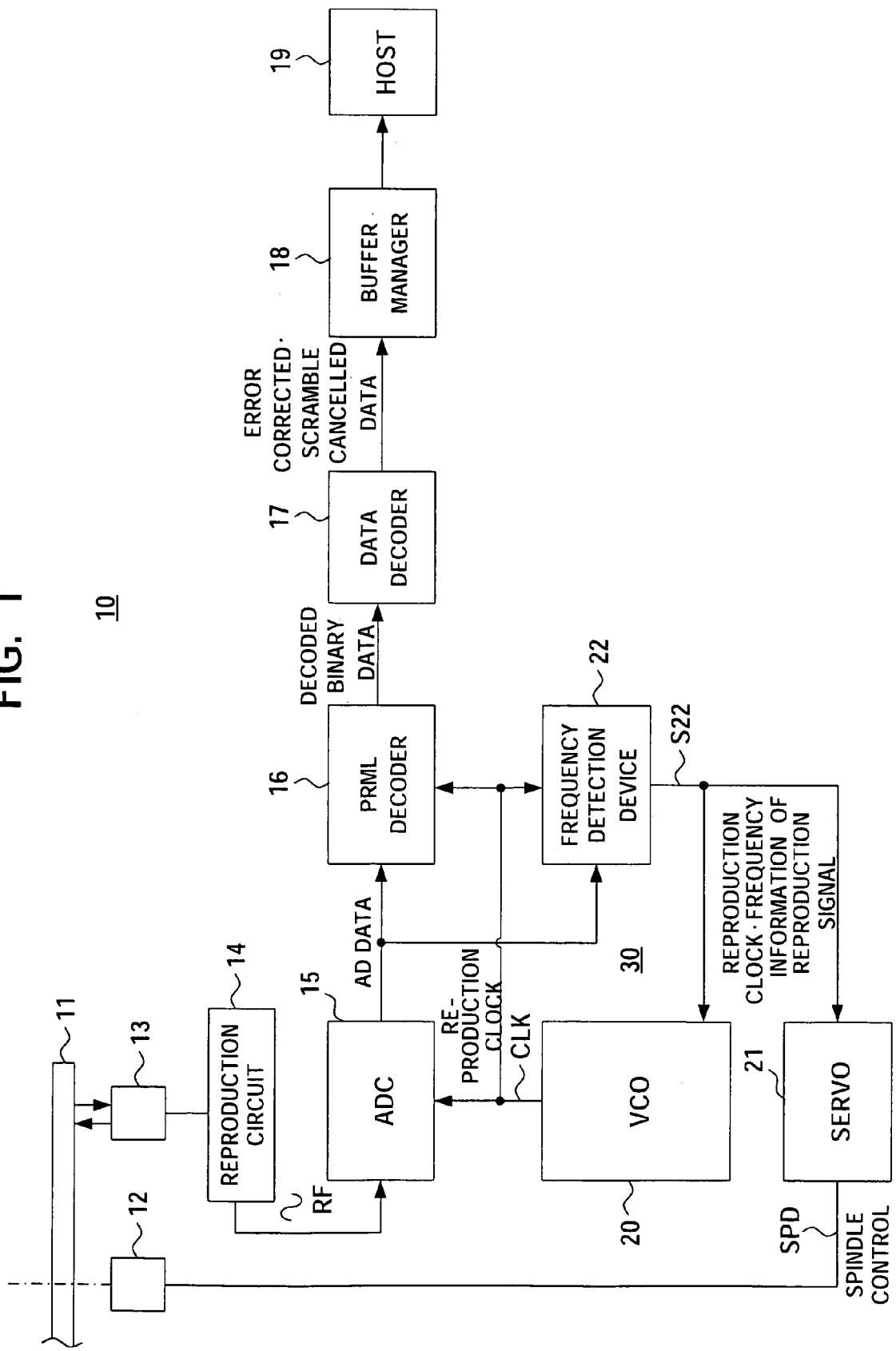
FIG. 1 is a block diagram illustrating a configuration of an RF signal processing system of an optical disk apparatus having a frequency detection device according to the present embodiment.

FIG. 1 is a block diagram illustrating a configuration of an RF signal processing system of an optical disk apparatus having a frequency detection device according to the present embodiment.

The RF signal processing system according to the present embodiment, for example, is formed as a circuit for detecting a frame sync pattern of "9T+9T" defined by a Blu-ray Disc data format as a maximum T-length and a frame sync pattern.

The RF signal processing system 10 in the present embodiment, as shown in FIG. 1, has an optical disk 11 of a recording medium, a spindle motor driver 12, an optical head 13, RF reproduction circuit 14, an analog-to-digital converter (ADC) 15, a PRML decoder 16, a data decoder 17, a buffer manager 18, a host device 19, a voltage controlled oscillator (VCO) 20, a servo circuit 21, and a frequency detection device 22.

The voltage controlled oscillator (VCO) 20, the servo circuit 21, and the frequency detection device 22 form a PLL system 30.

The driver 12 receives a spindle drive signal SPD from the servo circuit 21 and performs a processing operation such as start, stop, acceleration, and deceleration of the spindle motor.

The optical head 13 has a laser diode of a laser beam source, a photo detector for detecting a reflection light from the optical disk 11, an objective lens of an output end of a laser beam, and an optical system for emitting the laser beam through the objective lens to a disk recording surface and guiding the reflection light to the photo detector.

The RF signal reproduction circuit 14 a reproduction signal output from the optical head 13, amplifies for example, by a preamplifier, adjusts an amplitude of the signal by an AGC circuit, equalizes the signal by an analog equalizer, eliminates a high level noise, and outputs an analog RF signal to the ADC 15.

The ADC 15 converts the analog RF signal input from the RF signal reproduction circuit 14 to a digital signal AD, and outputs the result to the decoder 16 and the frequency detection device 22.

In this way, the digital signal AD generated by the ADC 15 is input to the PLL frequency detection device 22, and controlled so as to control an oscillation frequency of the VCO 20 by the PLL and match a sampling phase of the ADC 15.

The digital signal AD generated by the ADC 15 is synchronized with a reproduction clock CLK by the VCO 20, subjected to a predetermined decoding processing by the decoder 16, and input as a binary data to the data decoder 17. The binary data is decoded in the data decoder 17, corrected with an error, and transferred through the buffer manager 18 to the host device 19.

The VCO 20 is controlled by an oscillation frequency based on a control signal S22 generated by the frequency detection device 22, and it outputs the reproduction clock CLK to the ADC 15, the decoder 16, and the frequency detection device 22.

The servo circuit 21 generates a spindle drive signal SPD based on the control signal generated by the frequency detection device 22, and it outputs the same to the spindle motor driver 12.

The frequency detection device 22 receives the signal AD from the ADC 15, detects an object to be a sync pattern from a changing trend of the input AD data, generates a frequency information for controlling the reproduction clock based on the detected object to be the sync pattern, and outputs the generated frequency information as a control signal S22 to the VCO 20 and the servo circuit 21.

The frequency detection device 22 can generate a frequency information accurately even if a data changing point is not zero-crossed.

Figure 2:
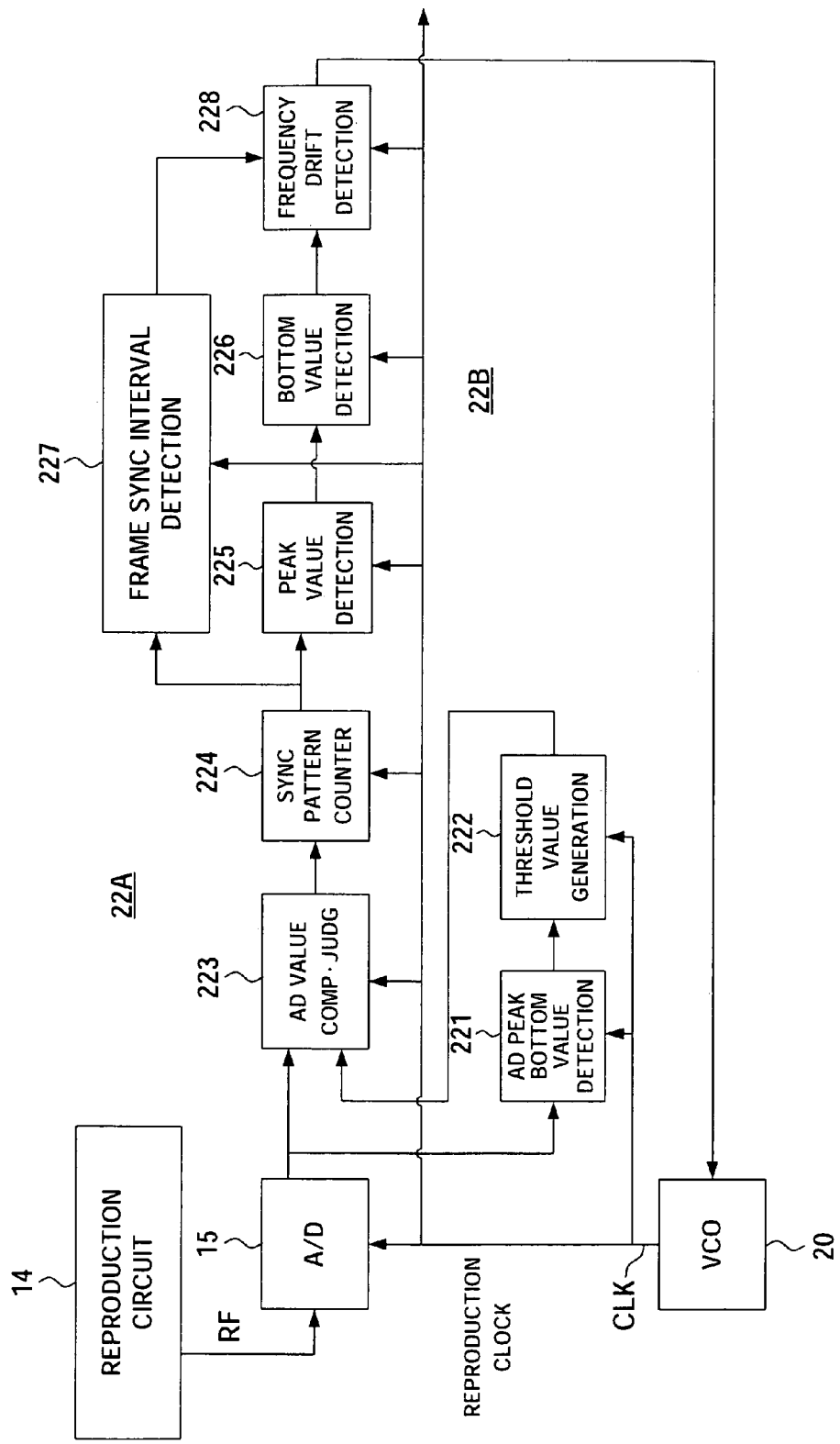
FIG. 2 is a block diagram illustrating a specific example of a configuration of the frequency detection device according to the present embodiment.
Figure 3:
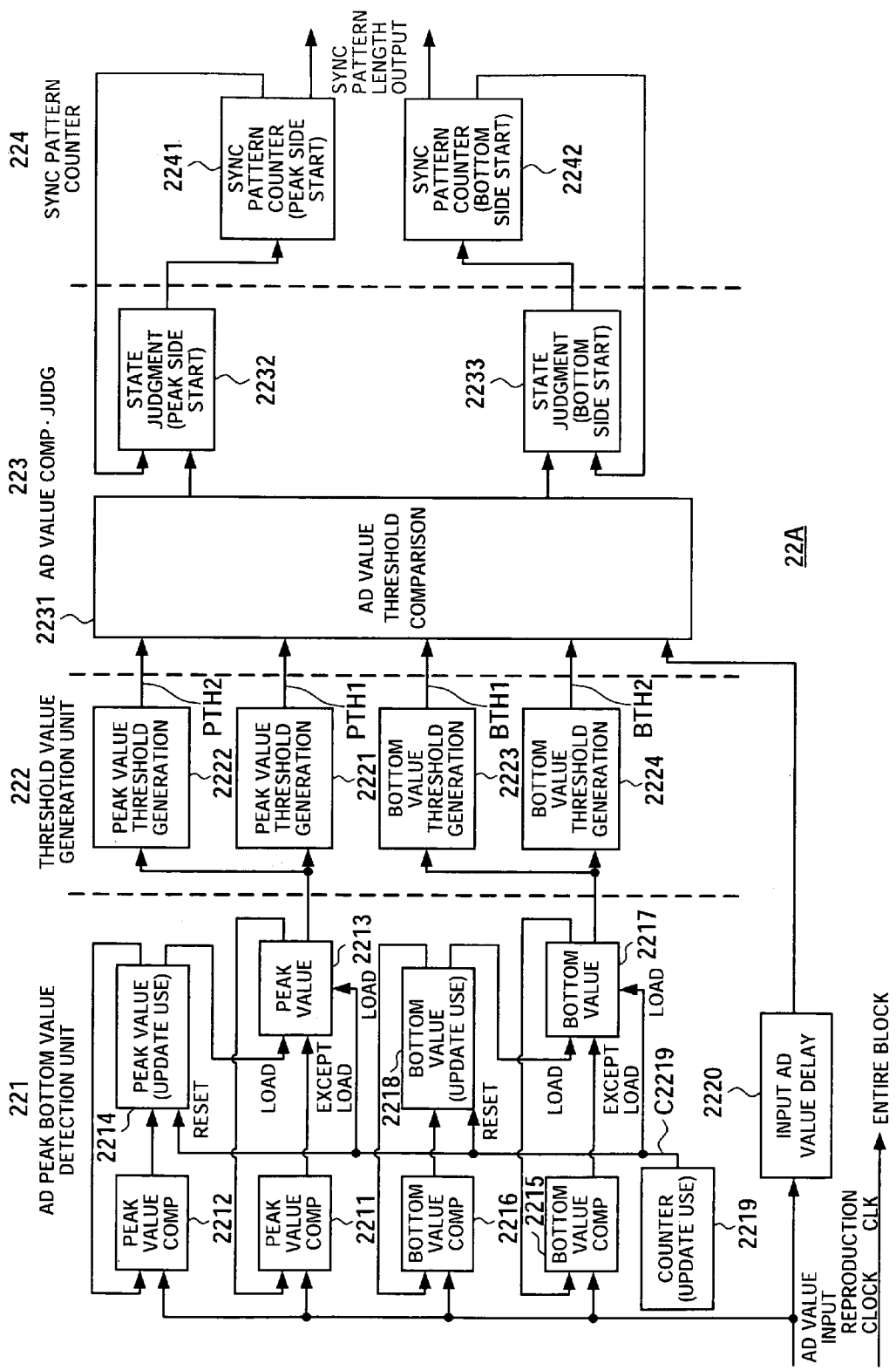
FIG. 3 is a block diagram illustrating a configuration of a sync pattern object detection unit according to the present embodiment.

FIG. 2 is a block diagram illustrating a specific example of a configuration of the frequency detection device 22 according to the present embodiment. FIG. 3 is a block diagram illustrating a configuration of the sync pattern object detection unit according to the present embodiment.

The frequency detection device 22, as shown in FIG. 2, has an AD peak bottom value detection unit 221, a threshold value generation unit 222, an AD value comparison judgment unit 223, a sync pattern counter 224, a peak value detection unit 225, a bottom value detection unit 226, a frame sync interval detection unit 227, and a frequency drift detection unit 228.

The AD peak bottom value detection unit 221, the threshold value generation unit 222, the AD value comparison judgment unit 223, and the sync pattern counter 224 form a sync pattern object detection unit 22A. And, the peak value detection unit 225, the bottom value detection unit 226, the frame sync interval detection unit 227, and the frequency drift detection unit 228 form a frequency information generation unit 22B.

The frequency detection device 22 including the sync pattern object detection unit 22A and the frequency information generation unit 22B, the ADC 15, and the VCO 20 form the PLL system 30.

The AD peak bottom value detection unit 221 detects a peak value and a bottom value of an AD value by the ADC 15.

The AD peak bottom value detection unit 221 detects the peak and the bottom value so as to respond automatically to the same due to an AD value to be input having a variable value range based on a previous stage.

The AD peak bottom value detection unit 221 updates the peak and the bottom values with each constant count number of the reproduction clock due to the AD value range changing during reproducing based on a data recording state.

The AD peak bottom value detection unit 221 having the above functions, for example, as shown in FIG. 3, has peak value comparison units 2211 and 2212, a peak value holding unit 2213, an update peak value holding unit 2214, bottom value comparison units 2215 and 2216, a bottom value holding unit 2217, a update bottom value holding unit 2218, an update counter 2219, and an input AD value delay unit 2220.

The peak value comparison unit 2211 compares a peak value of an AD value input from the ADC 15 with a peak of an AD value held in the peak value holding unit 2213 with each constant count number and outputs a larger AD value to the peak value holding unit 2213.

The peak value comparison unit 2212 compares a peak value of the AD value input from the ADC 15 with a peak of an AD value held in the update peak value holding unit 2214 and outputs a larger AD value to the update peak value holding unit 2214.

The peak value holding unit 2213 holds the peak value from the peak value comparison unit 2211 except for the time of a load of an update value, loads the peak value held in the update peak value holding unit 2214 when receiving a count signal C2219 from the counter 2219, and updates the peak value to be held.

The update peak value holding unit 2214 holds a peak value from the peak value comparison unit 2212, and the holding peak value is loaded to the peak value holding unit 2213 when receiving the counter signal C2219 from the counter 2219 and the held peak value is reset.

The bottom value comparison unit 2215 compares a bottom value of the AD value input from the ADC 15 with a bottom of an AD value held in the bottom value holding unit 2217 with each constant count number and outputs a smaller (larger to a negative side) AD value to the bottom value holding unit 2217.

The bottom value comparison unit 2216 compares a bottom value between the AD value input from the ADC 15 and the AD value held in the update bottom value holding unit 2218 and outputs a smaller (larger to a negative side) AD value to the update bottom value holding unit 2218.

The bottom value holding unit 2217 holds the bottom value input from the bottom value comparison unit 2215 except for the time of the load of the update value, and loads the bottom value held in the update bottom value holding unit 2218 when receiving a count signal C2219 from the counter 2219 and updates the bottom value to be held.

The update bottom value holding unit 2218 holds a bottom value input from the bottom value comparison unit 2216, and the holding bottom value is loaded to the bottom value holding unit 2217 when receiving the counter signal C2219 from the counter 2219 and the held bottom value is reset.

The counter 2219 counts the reproduction clock CLK input from the VCO 20 up to a predetermined count number, for example, a 512-count, and outputs the count signal C2219 to the peak value holding unit 2213, the update peak value holding unit 2214, the bottom value holding unit 2217, and the update bottom value holding unit 2218 after counting 512.

Figure 4:
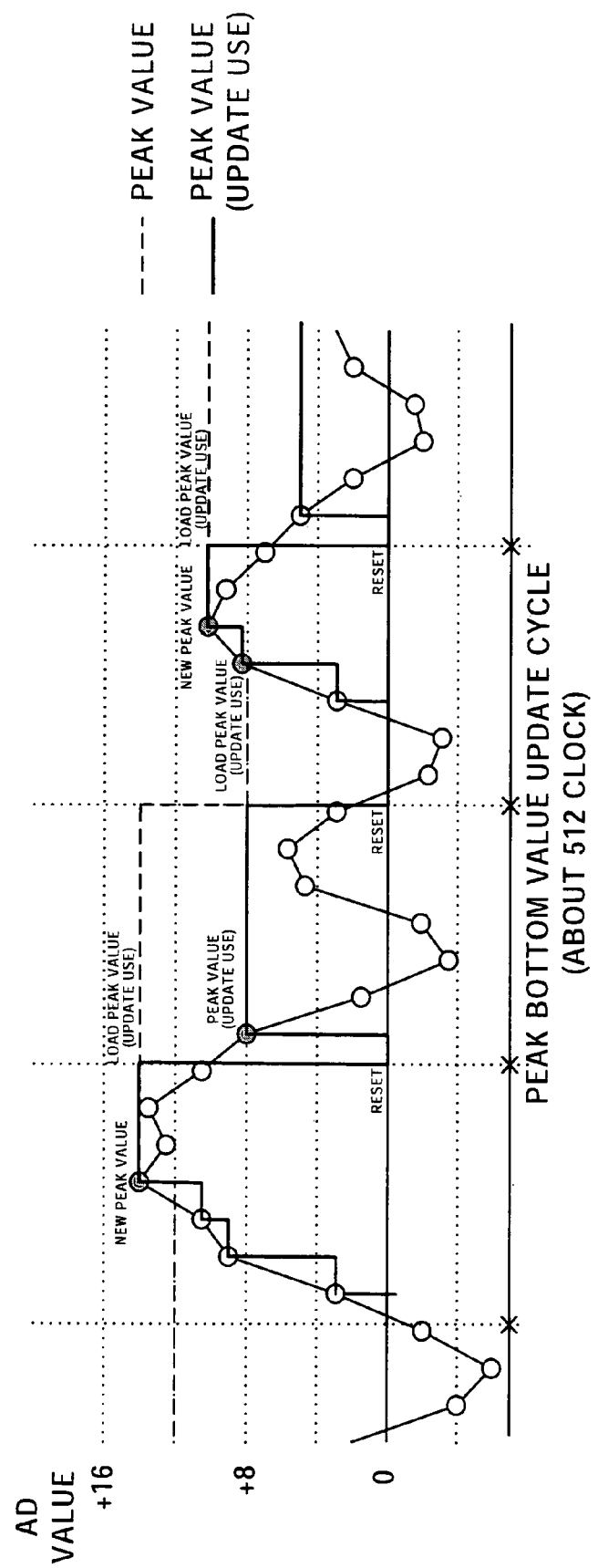
FIG. 4 is a view illustrating an example of an AD peak value detection operation in an AD value peak bottom detection unit according to the present embodiment.

The AD peak bottom value detection unit 221 in the present embodiment, as shown in FIG. 4, updates the peak value to be held in the peak value holding unit 2213 with each constant count number of the reproduction clock CLK by the count signal C2219 of the counter 2219 due to the AD value range changing based on a data recording state in reproducing.

In the same way, the AD peak bottom value detection unit 221 in the present embodiment, as shown in FIG. 4, updates the bottom value to be held in the bottom value holding unit 2217 with each constant count number of the reproduction clock CLK by the count signal C2219 of the counter 2219 due to the AD value range changing based on the data recording state in reproducing.

The threshold value generation unit 222 functions as a setting unit for setting a predetermined hysteresis with respect to the peak value and the bottom value held in the peak value holding unit 2213 and the bottom value holding unit 2217 in the AD peak bottom value detection unit 221.

Specifically, the threshold value generation unit 222 generates the threshold value from the peak value and the bottom value generated by the AD peak bottom value detection unit 221.

The threshold value generated by the threshold value generation unit 222 is defined as a reference value for judging whether or not the AD value to be input is a data with a pattern having a long inversion interval (long-T).

The threshold value generation unit 222, as shown in FIG. 3, has a first peak value threshold generation unit 2221, a second peak value threshold generation unit 2222, a first bottom value threshold generation unit 2223, and a second bottom value threshold generation unit 2224.

FIG. 5 is a view illustrating a relationship of the threshold value generated by the threshold value generation unit 222 in the present embodiment.

The threshold value generation unit 222 in the present embodiment generates a first threshold PTH1 for a long-T start reference and a second threshold PTH2 for a long-T end reference at the peak side, and also generates a first threshold BTH1 for the long-T start reference and a second threshold BTH2 for the long-T end reference at the bottom side.

The AD value comparison judgment unit 223 has a function as a judgment unit comparing hysteresis values of the peak value and the bottom value generated by the threshold value generation unit 222 with the input digital signal of AD value, and judging whether or not the input AD value exceeds the hysteresis value of the peak value and falls the hysteresis value of the bottom value, a function as a determination unit judging from the above judged result that the input AD value exceeding the hysteresis value of the peak value and falling below the hysteresis value of the bottom value is continued, and determining that the pattern having a long inversion interval (long-T) is continued, and a function as a pattern determination unit judging whether or not the pattern having the long inversion interval (long-T) at the opposite side to the peak or the bottom is continued after detecting the pattern having the long inversion interval (long-T), and determining a case where the pattern having the long inversion interval is continued successively twice as an object to be the frame sync pattern.

The AD value comparison judgment unit 223 compares the first and second peak value thresholds PTH1 and PTH2 and the first and second bottom value thresholds BTH1 and BTH2 generated by the threshold value generation unit 222 with an AD value where the input AD value is delayed in the input AD value delay unit 220 so as to correspond to a processing of the threshold value unit 222, and judges the AD value forming the pattern with the long inversion interval (long-T).

The judgment for the long-T is performed separatively in two cases of a pattern continuing the peak side and the bottom side successively and a pattern continuing the bottom side and the peak side successively. The judgment means a judgment of "9T+9T" of the object to be the frame sync pattern for the Blu-ray Disc data format.

The AD value comparison judgment unit 223 in the present embodiment, as shown in FIG. 3, has an AD value threshold comparison unit 2231, a peak side state judgment unit 2232 judging a start state at the peak side, and a bottom side state judgment unit 2233 judging a start state at the bottom side.

The judgment of the object to be the frame sync pattern is performed by detecting a first long-T (at the peak side or the bottom side) and then detecting the long-T at the opposite side.

In the present embodiment, a limit monitor portion LMT is set to a period (clock count number) from a first detection of the long-T to the following detection of the long-T at the opposite side.

The AD value comparison judgment unit 223 assumes that the object to be the frame sync pattern can be detected when starting the detection of the long-T at the opposite side from an end of a detection of the first long-T within the limit monitor portion LMT, otherwise assumes that the object to be the frame sync pattern is not detected when not starting the detection of the long-T at the opposite side within the limit monitor portion LMT and resets the detection state.

In this way, the limit monitor portion LMT is set in the period from the end of the detection of the first long-T to a start of the detection of the following long-T at the opposite side, so a case where a short-T (for example, 2T) which is not zero-crossed is continued next to the first long-T and the first long-T and the long-T at the opposite side are successively continued is not erroneously determined as the frame sync pattern.

The set limit monitor portion LMT is limited to a half of a clock number of detecting the first long-T. In the Blu-ray Disc data format, a maximum T-length is "9T" and a minimum T-length is "2T", and the frame sync pattern is "9T+9T". As a situation where the frame sync pattern is erroneously determined by entering another pattern between "9T+9T", "9T+2T+2T+9T" is assumed as the shortest case and the above limit is determined based on a ratio between 9T and "2T+2T".

FIG. 6 is a view illustrating an example of a detection of the object to be the frame sync pattern in the AD value comparison judgment unit 223 according to the present embodiment.

FIG. 7 is a view illustrating an example of an interpretation of the detection because of determining the object not to be the frame sync pattern in the AD value comparison judgment unit 223 according to the present embodiment.

In the example shown in FIG. 6, a count of T at the peak side is started by applying a first peak value threshold PTH1 as a reference, and the count is stopped at a second peak value threshold PTH2. In the example, the count value of the frame sync pattern is "7".

The frame sync pattern of the limit monitor portion LMT from the first long-T to the following long-T is counted, and the count value is "3" in an example shown in FIG. 6; as a result, a judgment of the limit monitor portion becomes "7/2=3.5>3", so a measurement of the frame sync pattern is continued.

In the following long-T, namely, at the bottom side, the count of T at the bottom side is started by applying the first bottom value threshold BTH1 as a reference, and the count is stopped in the second bottom value threshold BTH2. In this example, the count value of the frame sync pattern is "6".

In FIG. 6, after detecting the pattern having the long inversion interval (long-T), a pattern having the long inversion interval at the opposite side (long-T) is judged successively. Since the patterns having the long inversion interval are continued twice, it is determined as the object to be the frame sync pattern.

In an example shown in FIG. 7, the count of T at the peak side is started by applying the first peak value threshold PTH1 as a reference, and the count is stopped in the second peak value threshold PTH2. In this example, the count value of the frame sync pattern is "3".

The frame sync pattern of the limit monitor portion LMT from the first long-T to the following long-T is counted, and the count value is "7" in an example shown in FIG. 7; as a result, a judgment of the limit monitor portion becomes "3/2=1.5<7", so the measurement of the frame sync pattern is interrupted.

In this way, by monitoring a transition state of the AD data, the pattern is determined not to be "9T+9T".

In FIG. 7, by monitoring the transition state of the AD data in the limit monitor portion LMT, the pattern is determined not to be "9T+9T". And, the detection is interrupted due to the pattern not being the object to be the frame sync pattern.

The sync pattern counter 224 counts the number of judging clocks of the object to be the frame sync pattern when determining the object to be the frame sync pattern and functions as a measurement unit for measuring the same as a length of the object to be the frame sync pattern.

The sync pattern counter 224, as shown in FIG. 3, has a peak side sync pattern counter 2241, and a bottom side sync pattern counter 2242.

The peak side sync pattern counter 2241 functions as a counter of the frame sync pattern of "9T+9T" for allowing a reset in response to a detection start instruction of the long-T and finishing a count in response to a frame sync pattern detection end instruction from the peak side state judgment unit 2232 of the AD value comparison judgment unit 223.

The bottom side sync pattern counter 2242 functions as a counter of the frame sync pattern of "9T+9T" for allowing a reset in response to a detection start instruction of the long-T and finishing a count in response to a frame sync pattern detection end instruction from the bottom side state judgment unit 2233 of the AD value comparison judgment unit 223.

The sync pattern counters 2241 and 2242 are used for checking a limitation from the end of the detection of the first long-T to the start of the detection of the following long-T at the opposite side in the AD value comparison judgment unit 223.

The peak value detection unit 225 detects a peak value for detecting the maximum long-T with respect to a counted result of the T-length of an output signal from the sync pattern counter 224.

The bottom value detection unit 226 detects a bottom value from a plurality of peak detection results for eliminating a defect signal.

The frame sync interval detection unit 227 detects the frame sync pattern based on the counted result of the T-length of the output signal from the sync pattern counter 224, detects an interval of the frame sync pattern, and outputs the detected result to the frequency drift detection unit 228.

The frequency drift detection unit 228 calculates a difference between the bottom value detection result by the bottom value detection unit 226 and the maximum T-length reference value, or a difference between the frame sync pattern interval detection result by the frame sync interval detection unit 227 and the frame sync pattern interval reference value, generates the control signal S22 for controlling a reproduction clock frequency of the VCO 20 from the difference, and outputs the same to the VCO 20 and the servo circuit 21.

Below, an operation in the above configuration will be explained.

A reproduction signal output from the optical head 13 is amplified, for example, by a preamplifier in the RF signal reproduction circuit 14, adjusted with an amplitude, equalized by an analog equalizer, eliminated with a high-level noise, and output as an analog RF signal to the ADC 15.

In the ADC 15, the analog RF signal from the RF signal reproduction circuit 14 is converted to a digital signal AD and output to the decoder 16 and the frequency detection device 22.

The digital signal AD from the ADC 15 is synchronized with the reproduction clock CLK by the VCO 20, subjected to a predetermined decoding processing by the decoder 16, and input as a binary data to the data decoder 17. The binary data is decoded in the data decoder 17, corrected with an error, and transferred via the buffer manager 18 to the host device 19.

In the frequency detection device 22, the peak value and the bottom value of the AD value input are detected by the AD peak bottom value detection unit 221. In the AD peak bottom value detection unit 221, the AD value range changes based on the data recording state of the optical disk 11 during reproducing, so the peak value and the bottom value are updated with each constant count number of the reproduction clock. The peak value and the bottom value detected by the AD peak bottom value detection unit 221 are supplied to the threshold value generation unit 222.

In the threshold generation unit 222, the threshold value of a reference for judging whether or not the AD value to be input is the long-T data is generated from the peak value and the bottom value generated by the AD peak bottom value detection unit 221.

The threshold values generated in the threshold value generation unit 222 are a long-T start reference threshold PTH1 and a long-T end reference threshold PTH2 at the peak side, and the same BTH1 and BTH2 at the bottom side, which are output to the AD value comparison judgment unit 223.

In the AD value comparison judgment unit 223, the threshold value from the threshold value generation unit 222 and an AD value delayed so as to correspond to a processing of the threshold value generation unit 222 are compared and the AD value forming the long-T is judged. The judgment of the long-T is performed separatively in two cases of a pattern continuing the peak side and the bottom side successively and a pattern continuing the bottom side and the peak side successively.

In the AD comparison judgment unit 223, the judgment of the object to be the frame sync pattern is performed by detecting the first long-T (at the peak side or the bottom side) and detecting the long-T at the opposite side. Since the period (the number of the clock count) from detecting the first long-T to detecting the following long-T at the opposite side is limited, the object to be the frame sync pattern is assumed to be detected when a detection of the long-T at the opposite side starts from the end of the detection of the first long-T within the limited time; otherwise, the object to be the frame sync pattern is assumed to be not detected when the detection of the long-T at the opposite side does not start within the limited time and a detection state is reset.

In the sync pattern counter 224, a reset is performed in response to the long-T detection start instruction by the AD value comparison judgment unit 223, the frame sync pattern of "9T+9T" is counted, and the count is finished in response to the frame sync pattern detection end instruction.

The result of the sync pattern counter 224 is supplied to the peak value detection unit 225 and the frame sync interval detection unit 227.

In the peak value detection unit 225, the peak value detection for the maximum T-length detection is performed on the counted result of the T-length of the output signal from the sync pattern counter 224, and the bottom value is detected in the bottom value detection unit 226 from a plurality of the peak detection results for eliminating the defect signal.

In the frame sync pattern interval detection unit 227, the frame sync pattern is detected based on the counted result of the T-length of the output signal from the sync pattern counter 224, and the interval of the frame sync pattern is detected.

In the frequency drift detection unit 228, a difference between the bottom value detection result by the bottom value detection unit 226 and the maximum T-length reference value is calculated or a difference between the frame sync pattern interval detection result by the frame sync pattern interval detection unit 227 and the frame sync pattern interval reference value is calculated. From the difference, the control signal S22 for controlling the reproduction clock frequency of the VCO 20 is generated and output to the VCO 20 and the servo circuit 21.

In the VCO 20, an oscillation frequency is controlled based on the control signal S22 of the frequency detection device 22, and the reproduction clock CLK controlled with the frequency is output to the ADC 15, the decoder 16, and the frequency detection device 22.

In the servo circuit 21, a spindle drive signal SPD is generated based on the control signal S22 of the frequency detection device 22 and output to the spindle driver 12.

As described above, according to the present embodiment, the frequency detection device 22 has: the AD peak bottom value detection unit 221 detecting the peak value and the bottom value from the input digital signal AD, holding the detected peak value and bottom value during a predetermined time, and detecting and updating the peak value and the bottom value from the detected input digital signal AD during holding the peak value and the bottom value; the threshold value generation unit 222 generating a predetermined threshold value (hysteresis value) with respect to the detected peak value and bottom value; the AD value comparison judgment unit 223 comparing the hysteresis values of the peak value and the bottom value with the input digital signal, judging whether or not the input digital signal exceeds the hysteresis value of the peak value and falls below the same of the bottom value, judging that the input digital signal exceeding the hysteresis value of the peak value and falling below the same of the bottom value is continued from the judged result, determining that the pattern having the long inversion interval (long-T) is continued, detecting the pattern having the long inversion interval (long-T), judging whether or not the pattern having the long inversion interval (long-T) at the opposite side to the peak or the bottom is continued, and determining a case where the pattern having the long inversion interval (long-T) is continued successively twice; and the sync pattern counter 224 counting the number of the judging clock of the frame sync pattern during determining the object to be the frame sync pattern and measuring the same as a length of the object to be the frame sync pattern. Therefore, the following effects can be obtained.

In this way, in the present embodiment, the frame sync pattern is detected from a changing trend of the input AD value, so the object to be the frame sync pattern can be detected in the case where a short-T of the input AD value is not zero-crossed and the frequency drift of the reproduction clock can be detected as a reproduction clock count value of the frame sync pattern. Consequently, the frequency of a PLL clock can be detected and it can be applied to a control for the number of a frequency of PLL and a control for a spindle.

In the present embodiment, although a detection system of the frame sync pattern of "9T+9T" of the Blu-ray Disc is described as an example, the frame pattern detection system of the present embodiment also can be applied to a detection system of "11T+11T" of compact disk (CD).

According to embodiments of the present invention, an input analog signal, for example, is sampled based on a clock, converted to a digital signal, and input to a frequency detection device.

In the frequency detection device, an object to be a sync pattern is detected based on a changing trend of the input digital signal, a frequency information for controlling a reproduction clock is generated based on the detected object to be the sync pattern and output as a control signal to an oscillation circuit.

In the oscillation circuit, a clock having a predetermined frequency based on a frequency corresponding to the control signal is generated and supplied to a converter.

According to embodiments of the present invention, the frame sync pattern is detected based on the changing trend of the input digital signal value, so the object to be the frame sync pattern can be detected and a frequency drift in the reproduction clock can be detected as a reproduction clock count value of the frame sync pattern even if the input digital signal value is not zero-crossed in a short-T. Therefore, a frequency of the PLL clock can be detected and it can be applied to a control for a frequency of PLL and a control for a spindle.

It should be understood by those skilled in the art that various modifications, combinations, subcombinations and alterations may occur depending on design requirements and other factors so far in as they are within scope of the appended claims or the equivalents thereof.

What is claimed is:

1. A frequency control device comprising:
    an oscillation circuit outputting a clock having a frequency corresponding to a control signal;
    a converter sampling an analog input signal having a predetermined pattern based on the clock and converting the signal to a digital signal; and
    a frequency detection device detecting an object to be a sync pattern from a changing trend of the digital signal, generating a frequency information for controlling a reproduction clock based on the detected object to be the sync pattern, and outputting the frequency information as the control signal to the oscillation circuit, wherein the frequency detection device comprises
    a peak bottom value detection unit detecting a peak value and a bottom value from an input digital signal,
    a setting unit setting a predetermined hysteresis with respect to the detected peak value and bottom value,
    a comparison judgment unit comparing the hysteresis values of the peak value and the bottom value with the input digital signal, detecting a pattern having a long inversion interval, judging whether or not a pattern having a long inversion interval at an opposite side to the peak or the bottom is continued, and determining a case where the pattern having the long inversion interval is continued as an object to be a frame sync pattern, and
    a measurement unit counting a number of judging clocks of the object to be the frame sync pattern during determining the object to be the frame sync pattern, and measuring the number of clocks as a length of the object to be the frame sync pattern.

2. The frequency control device as set forth in claim 1, wherein the comparison judgment unit comprises
    a judgment unit comparing the hysteresis values of the peak value and the bottom value with the input digital signal, and judging whether or not the input digital signal exceeds the hysteresis value of the peak value and falls the hysteresis value of the bottom value,
    a determination unit judging the input digital signal exceeding the hysteresis value of the peak value and falling the hysteresis value of the bottom value is continued from the judged result of the judgment unit, and determining that the pattern having the long inversion interval is continued, and
    a pattern determination unit judging whether or not the pattern having the long inversion interval at the opposite side to the peak or the bottom is continued after detecting the pattern having the long inversion interval, and determining a case where the pattern having the long inversion interval is continued successively twice as the object to be the frame sync pattern.

3. The frequency control device as set forth in claim 2, wherein the peak bottom detection unit comprises
    a peak bottom value detection unit detecting the peak value and the bottom value from the input digital signal,
    a holding unit holding the detected peak value and bottom value during a predetermined time, and
    an update unit detecting the peak value and the bottom value from the detected input digital signal during holding the peak value and the bottom value in the holding unit.

4. The frequency control device as set forth in claim 1, wherein the comparison judgment unit sets a limit monitor portion in a period from a detection of a first pattern having the long inversion interval to a detection of the following pattern having the long inversion interval at the opposite side, and determines that the object to be the frame sync pattern is detected when a detection of the long pattern at the opposite side starts from the finish of the detection of the first long pattern within the limit monitor portion, while it determines that the object to be the frame sync pattern is not detected when the detection of the long pattern at the opposite side does not start within the limit monitor portion.

5. The frequency control device as set forth in claim 1, wherein the peak bottom detection unit comprises
    a peak bottom value detection unit detecting the peak value and the bottom value from the input digital signal,
    a holding unit holding the detected peak value and bottom value during a predetermined time, and
    an update unit detecting the peak value and the bottom value from the detected input digital signal during holding the peak value and the bottom value in the holding unit.

6. An information reproduction apparatus comprising:
    a recording medium;
    a converter sampling a sine-curved signal reproduced from the recording medium based on a clock and converting the signal to a digital signal;
    an oscillation circuit outputting the clock having a frequency corresponding to a control signal; and
    a frequency detection device detecting an object to be a sync pattern from a changing trend of the digital signal, generating a frequency information for controlling a reproduction clock based on the detected object to be the sync pattern, and outputting the frequency information as the control signal to the oscillation circuit, wherein the frequency detection device comprises
    a peak bottom value detection unit detecting a peak value and a bottom value from an input digital signal, a setting unit setting a predetermined hysteresis with respect to the detected peak value and the bottom value, a comparison judgment unit comparing the hysteresis values of the peak value and the bottom value with the input digital signal, detecting a pattern having a long inversion interval, judging whether or not a pattern having a long inversion interval at the opposite side to the peak or the bottom is continued, and determining a case where the pattern having the long inversion interval is continued as an object to be a frame sync pattern, and a measurement unit counting a number of judging clocks of the object to be the frame sync pattern during determining the object to be the frame sync pattern, and measuring the number of clocks as a length of the object to be the frame sync pattern.

7. The information reproduction apparatus as set forth in claim 6, wherein the comparison judgment unit comprises a judgment unit comparing the hysteresis values of the peak value and bottom value with the input digital signal, and judging whether or not the input digital signal exceeds the hysteresis value of the peak value and falls below the hysteresis value of the bottom value, a determination unit judging the input digital signal exceeding the hysteresis value of the peak value and falling below the hysteresis value of the bottom value is continued from the judged result of the judgment unit, and determining that the pattern having the long inversion interval is continued, and a pattern determination unit judging whether or not the pattern having the long inversion interval at the opposite side to the peak or the bottom is continued after detecting the pattern having the long inversion interval, and determining a case where the pattern having the long inversion interval is continued successively twice as the object to be the frame sync pattern.

8. The information reproduction apparatus as set forth in claim 6, wherein the comparison judgment unit sets a limit monitor portion in a period from a detection of a first pattern having a long inversion interval to a detection of the following pattern having a long inversion interval at an opposite side, and determines that the object to be the frame sync pattern is detected when the detection of the long pattern at the opposite side starts from the finish of the detection of the first long pattern within the limit monitor portion, while it determines that the object to be the frame sync pattern is not detected when the detection of the long pattern at the opposite side does not starts within the limit monitor portion.

9. The information reproduction apparatus as set forth in claim 6, wherein the peak bottom detection unit comprises a peak bottom value detection unit detecting the peak value and the bottom value from the input digital signal, a holding unit holding the detected peak value and bottom value during a predetermined time, and an update unit detecting the peak value and the bottom value from the detected input digital signal during temporarily holding the peak value and the bottom value in the holding unit.

* * * * *